(12) United States Patent
Elata et al.

(10) Patent No.: US 7,423,794 B2
(45) Date of Patent: Sep. 9, 2008

(54) DEVICE AND METHOD FOR STACKED MULTI-LEVEL UNCOUPLED ELECTROSTATIC ACTUATORS

(75) Inventors: David Elata, Haifa (IL); Ofir Bochobza-Degani, Ashkelon (IL); Yael Nemirovsky, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 225 days.

(21) Appl. No.: 10/545,949

(22) PCT Filed: Feb. 15, 2004

(86) PCT No.: PCT/IL2004/000143

§ 371 (c)(1),
(2), (4) Date: Jun. 5, 2006

(87) PCT Pub. No.: WO2004/074167

PCT Pub. Date: Sep. 2, 2004

(65) Prior Publication Data

US 2006/0279862 A1    Dec. 14, 2006

(51) Int. Cl.
*G02B 26/08* (2006.01)
*G02B 26/00* (2006.01)
(52) U.S. Cl. .................................... 359/224; 359/295
(58) Field of Classification Search ............. 359/201, 359/202, 212, 224, 225, 290, 291, 295, 849
See application file for complete search history.

(56) References Cited

U.S. PATENT DOCUMENTS

| | | | |
|---|---|---|---|
| 4,956,619 A | 9/1990 | Hornbeck | |
| 5,061,049 A | 10/1991 | Hornbeck | |
| 5,535,047 A | 7/1996 | Hornbeck | |
| 5,999,303 A * | 12/1999 | Drake | 359/224 |
| 6,038,056 A | 3/2000 | Florence et al. | |
| 6,388,789 B1 | 5/2002 | Bernstein | |
| 6,480,320 B2 | 11/2002 | Nasiri | |
| 6,888,656 B2 * | 5/2005 | Miyajima et al. | 359/224 |
| 6,914,710 B1 | 7/2005 | Novotny et al. | |

OTHER PUBLICATIONS

The Lucent LamdaRouter: MEMS Technology of the Future Here Today Mar. 2002 (pp. 75-79), David J Bishop, C. Randy Giles, GP Austin, Lucent Techn.
GLV Applications—spec sheet (2 pages) Silicon Light Machines.
Linearization of Electrostatically Actuated Surface Micromachined 2-D Optical Scanner H. Hiroshi Toshiyoshi, W. Piyawattanametha, C. Chan, M.C. Wu.
Analog Devices (www.analog.com).

* cited by examiner

*Primary Examiner*—Alessandro Amari
(74) *Attorney, Agent, or Firm*—Edward Langer, Esq.; Shibolet & Co.

(57) ABSTRACT

A multi-level decoupled micro-actuator device comprising a first level substrate (410), a second level frame (420) stacked on said first level substrate (410), a third level frame (430) stacked on said second level frame (420).

17 Claims, 4 Drawing Sheets

DEVICE AND METHOD FOR STACKED MULTI-LEVEL UNCOUPLED ELECTROSTATIC ACTUATORS

FIELD OF THE INVENTION

Figure 1:
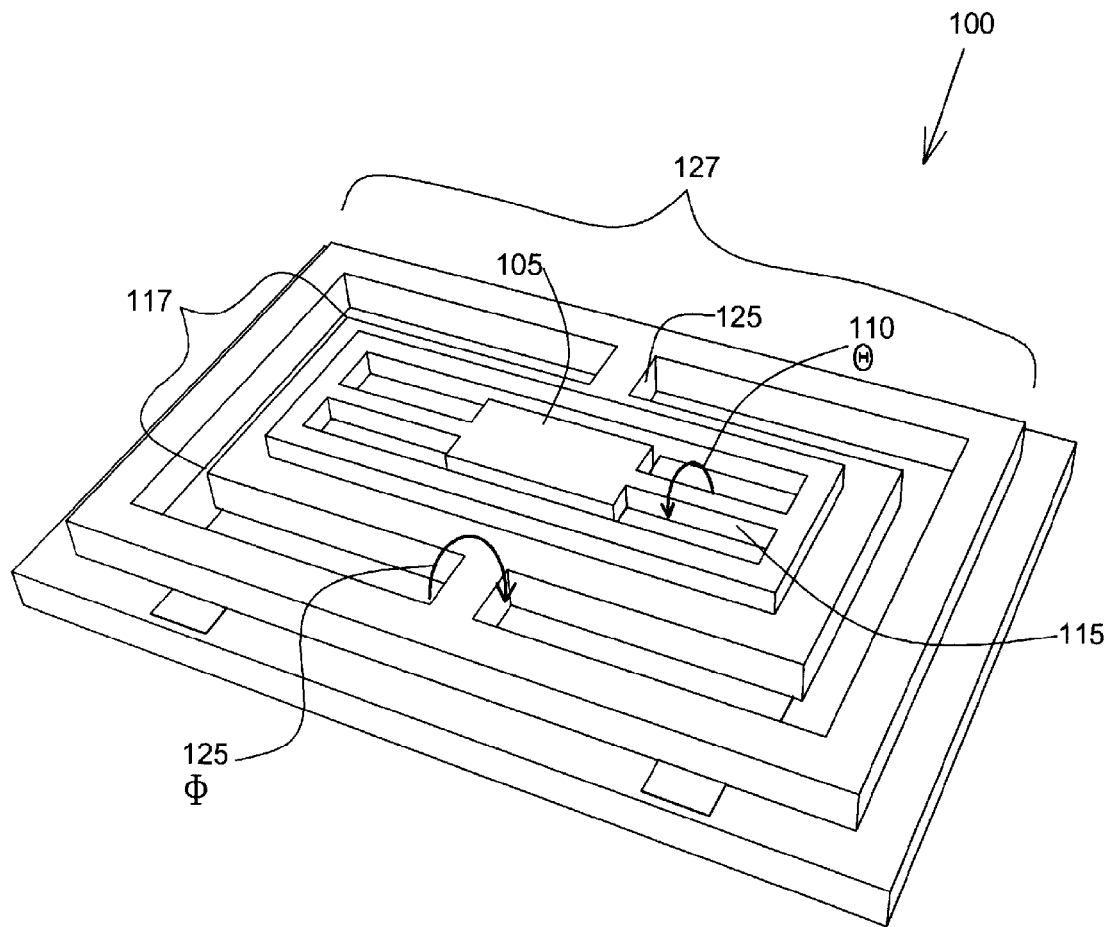

The present invention relates to micro electro-mechanical systems (MEMS) devices. More particularly, the present invention relates to a device and method for stacked multi-level uncoupled electrostatic actuators that may be used to drive optical micro-mirrors.

REFERENCES

[1] Data sheet of ADXL, at http://www.analog.com/
[2] L. J. Hornbeck U.S. Pat. Nos. 4,956,619; 5,061,049; 5,535,047
[3] See http://www.siliconlight.com/
[4] D. J. Bishop, C. R. Giles, and G. P. Austin, The Lucent LambdaRouter: MEMS technology of the future here today, IEEE Comm. Mag., Vol. 40(3), pp. 75-79, 2002.
[5] H. Toshiyoshi, W. Piyawattanametha, C. Cheng-Ta and M. C. Wu, "Linearization of electrostatically actuated surface micromachined 2-D optical scanner", JMEMS, 10, 2, pp. 205-214, 2001.

BACKGROUND OF THE INVENTION

Electrostatic actuation is the most prevalent means of driving micro electro-mechanical systems (MEMS) devices. State-of-the-art MEMS devices utilizing electrostatic actuation include: inertial sensors such as Analog Devices ADXL™ [1]; pressure sensors; RF switches and filters; MEMS displays such as TI-DLP™ [2], Silicon Light Machines' Grating Light Valve™ (GLV™) [3], optical cross-connect, e.g., Lucent LambdaRouter™ [4] and more.

The emerging technology of scanning micro-mirrors enables the processing of relatively compact and low cost digital and analog light. Among such applications are the Texas Instruments DLP™ used for modern, state of the art displays and the Lucent double-gimbaled WaveStar™ micro-mirror used in optical communication state-of-the-art all-optics routers. Other applications include barcode scanners, scanning confocal microscope, scanning for direct display on retina and more. A gimbal is a device that permits a body to incline freely around a predetermined axis, or suspends it so that it will remain level when its support is tipped.

In many MEMS applications multi-axis drive and control of deformable elements is required. Double-gimbaled micro-mirrors have been developed in order to achieve scanning in two dimensions. In state of the art double-gimbaled micro-mirror technology, the actuation of the two degrees of rotation is coupled due to electrostatic coupling effects. For example, the Lucent LambdaRouter™ uses a double-gimbaled micro-mirror to route optical information from a source fiber into a 2D array of target fibers. The electrostatic coupling between the two axes of rotation causes distortion of the picture that requires special linearization algorithms to reconstruct the correct rectangular domain. Moreover, the calibration has to be carried out for each individual device to account for its specific electromechanical properties. This in turn, increases the cost associated with these devices.

The principle of setting an element on a multi-gimbaled frame is well known, e.g., for use in traditional rotation gyroscopes. However, the use of electrostatic actuation to drive the gimbaled devices, results in a nonlinear coupling between the axes. As a result, the scan range becomes distorted [5]. Many control techniques have been proposed to deal with this nonlinear coupling effect. However, all such prior art has further complicated the calibration and operation of the device.

Therefore, there is a need in the art to provide a simpler device and method that avoids nonlinear coupling between the axes, when using electrostatic actuation to drive dual axes devices.

SUMMARY OF THE INVENTION

Accordingly, it is a principal object of the present invention to provide a device and method that avoids nonlinear coupling between the axes, when using electrostatic actuation to drive a micro-device with multiple rotation axes.

It is a further object of the present invention to provide a simpler device and method for electrostatic actuation to drive a micro-device with multiple rotation axes.

It is another object of the present invention to provide a device and method for electrostatic actuation to drive micro-devices with multiple rotation axes devices that is applicable for a wide variety of applications.

It is yet another object of the present invention to provide a device and method for electrostatic actuation to drive micro-devices with multiple rotation axes that enable larger scanning angles, while keeping the applied voltage relatively low.

A multi-axis electromechanical actuator is described, with no electrostatic coupling between the axes. The proposed new technology eliminates the problem of coupling between axes by using multi-level stacked actuators. The decoupling between the different axes of rotation is achieved by stacking each actuator over the deformable element of the previous level. This method is used to achieve dual-axis scanning with a fixed and independent electromechanical response of each axis. Each actuator has a single degree of freedom that is separately actuated. Therefore, there is no cross talk between the multiple axes, and a rectangular scanning domain is achieved with no need for calibration or special algorithms. This technology can be extended to more than two levels of stacking, thus enabling larger scanning angles, while keeping the applied voltage relatively low.

In accordance with a preferred embodiment of the present invention, there is provided a multi-level decoupled micro-actuator device for a micro-mirror having multiple axes, using micro electro-mechanical systems (MEMS)-on-MEMS stacking technology. The device includes a first level substrate having at least one first level bottom electrode on its upper side. The device also includes a second level frame stacked on the first level substrate, the second level frame having a first deformable element rotatable about the x-axis. The first deformable element includes at least one counter electrode on its lower side corresponding to, and oppositely charged to, the at least one first level bottom electrode and at least one second level bottom electrode on its upper side. The device further includes a third level frame stacked on the first deformable element, the third level frame comprising a second deformable element rotatable about the y-axis, the second deformable element being driven by at least one second level bottom counter electrode on its lower side corresponding to, and oppositely charged to, the at least one second level bottom electrode on the first deformable element, such that there is no coupling between the rotation of the first and second deformable elements, respectively, about the x-axis and the y-axis.

Additional features and advantages of the invention will become apparent from the following drawings and description.

BRIEF DESCRIPTIONS OF THE DRAWINGS

Figure 2:
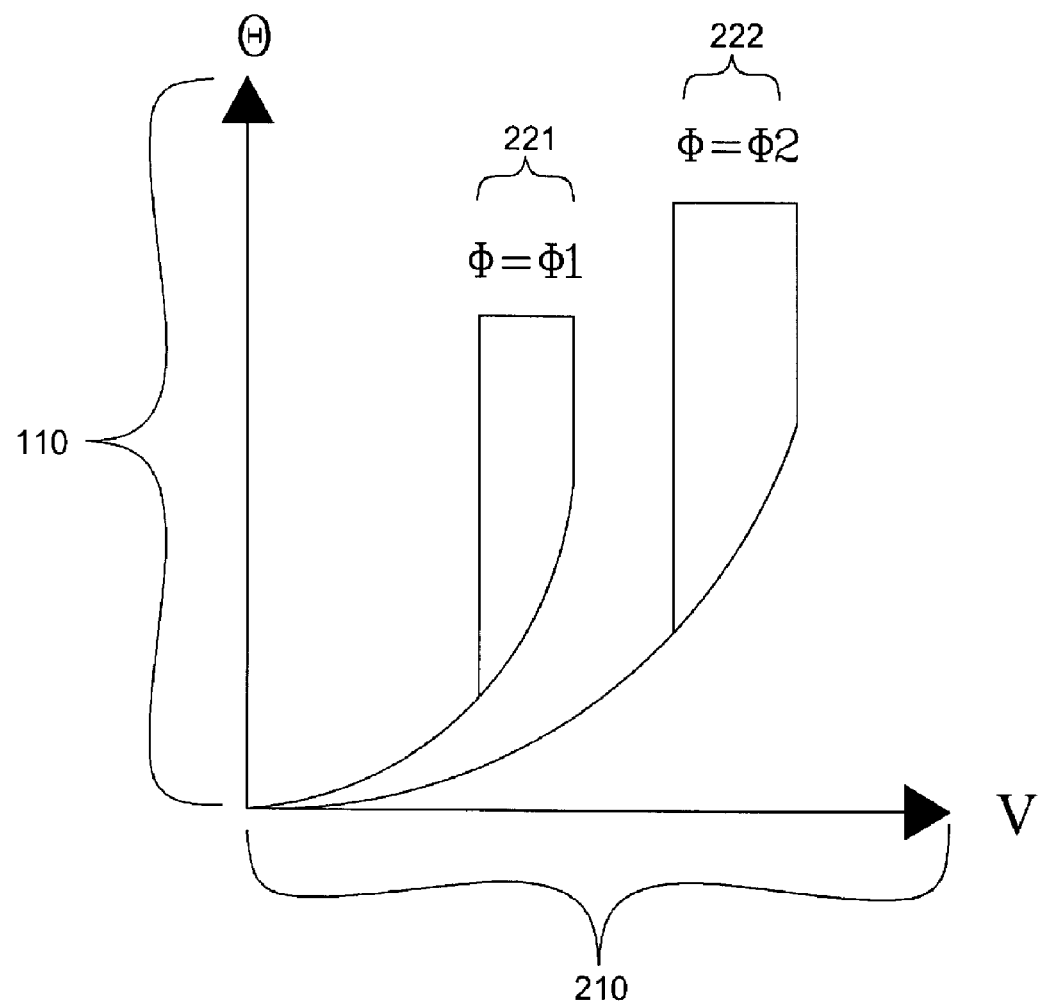
Figure 3:
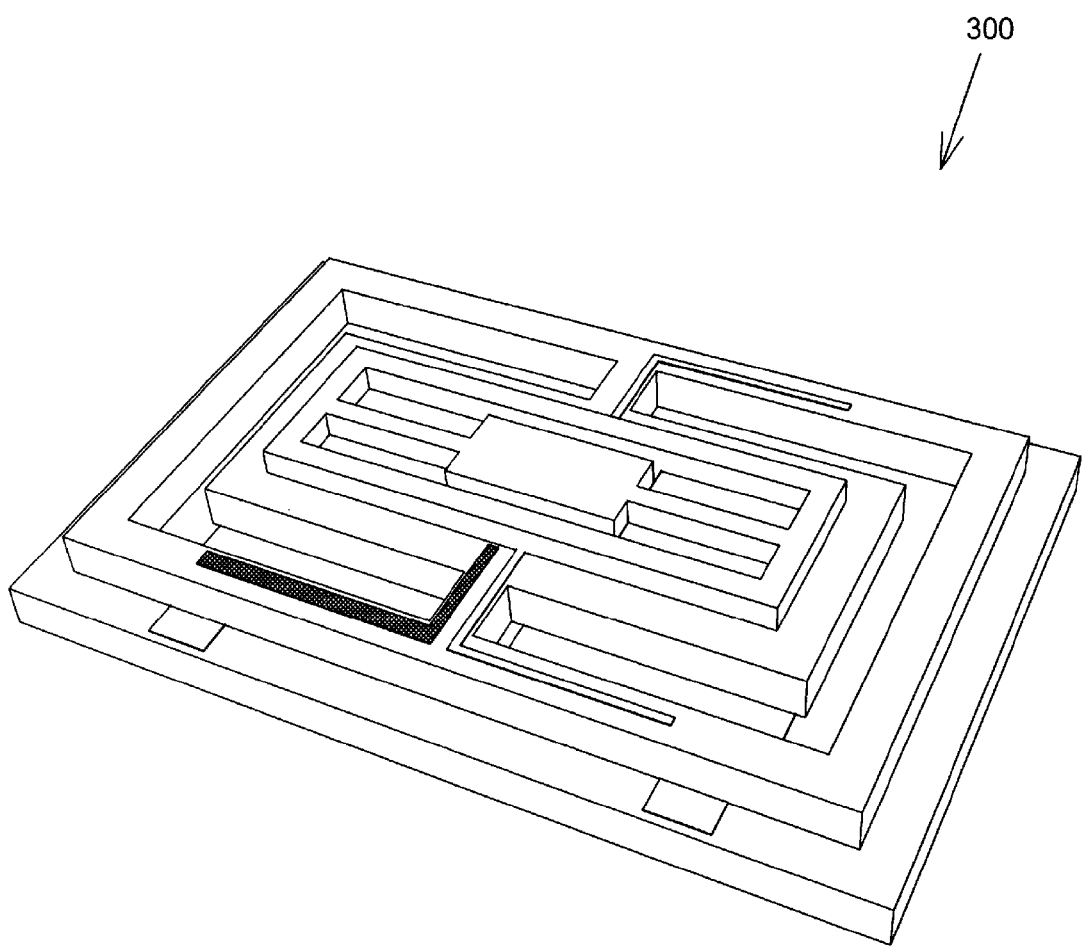
Figure 4:
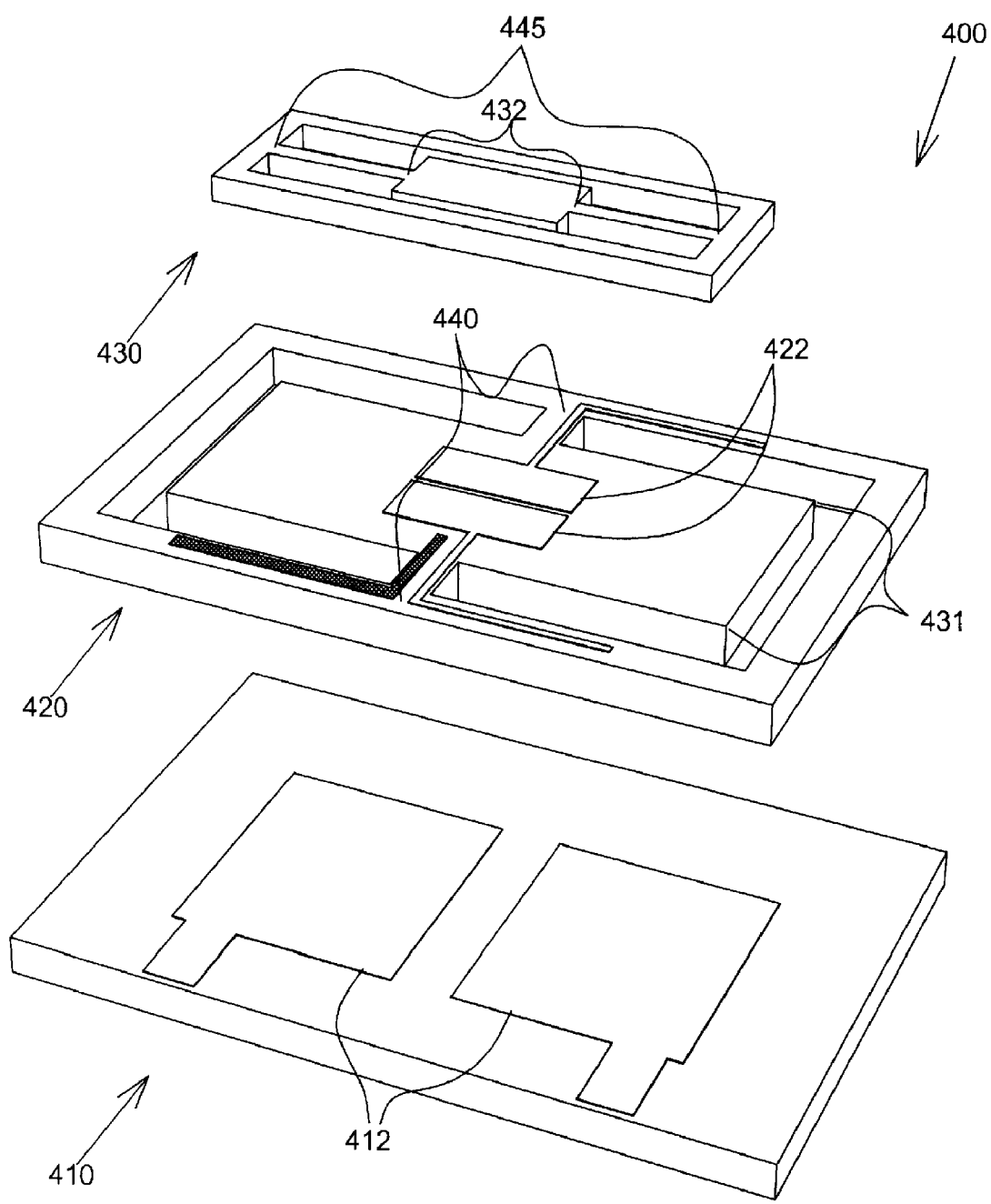

For a better understanding of the invention in regard to the embodiments thereof, reference is made to the accompanying drawings and description, in which like numerals designate corresponding elements or sections throughout, and in which:

FIG. 1 shows a schematic view of a double-gimbaled two-axis micro-mirror device, constructed to illustrate the principles of the current art;

FIG. 2 schematically presents the electromechanical response of the double-gimbaled two-axis micro-mirror device shown in FIG. 1, exhibiting the coupling between the two axes, constructed to illustrate the principles of the current art;

FIG. 3 shows a schematic illustration of a multi-stacked, uncoupled, two-axis micro-mirror device, constructed in accordance with the principles of the present invention; and FIG. 4 shows the separated layers of the device of FIG. 3, constructed in accordance with the principles of the present invention.

DETAILED DESCRIPTION OF THE PREFERRED EMBODIMENTS

The invention will now be described in connection with certain preferred embodiments with reference to the following illustrative figures so that it may be more fully understood. References to like numbers indicate like components in all of the figures.

The principal aim of the proposed technology is to eliminate the coupling between the different axes for the electrostatic actuators used to drive multiple axes micro-mirrors. The principle applied involves the decoupling of each axis. This is achieved by assembling the actuators such that the moving element of one level is the reference base of the next level. Thus, each succeeding level is driven relative to the moving element of the previous level. This is in contrast to the existing technology in which all levels are driven relative to the same fixed base.

To make clear the source of the nonlinear coupling between the two axes in the double gimbaled actuator, reference is now made to the system illustrated in FIG. 1, which shows a schematic view of a double-gimbaled two-axis micro-mirror device 100, constructed to illustrate the principles of the current art. A micro-mirror 105 is rotated over a first angle θ 110, about a first axis of support 115, which is connected to a first frame 117. First frame 117 is in turn-connected to a second frame 127. Second frame 127 is rotated over a second angle Φ 120, about a second axis of support 125, which is also connected to first frame 117.

FIG. 2 schematically presents an electromechanical response curve 200 of the double-gimbaled two-axis micro-mirror device shown in FIG. 1, exhibiting the coupling between the two axes, constructed to illustrate the principles of the current art. The electromechanical response of the inner frame is illustrated in FIG. 2, for various applied voltages, V 210. The angular response θ, over first angle 110 of the inner gimbal is affected by the external gimbal rotation over second angle Φ 120. Two curves are shown. A first curve 221 corresponds to values of first angle θ 110 for a value of second angle $\Phi=\Phi_1$ and a second curve 222 corresponds to values of first angle θ 110 for a value of second angle $\Phi=\Phi_2$. As shown, second angle deflection, φ 120 of the external frame affects the electromechanical response of the inner frame. This is due to the fact that as the external frame is deflected, the inner frame is deflected with it, while the driving bottom electrodes remain fixed. Consequently, the relative position between the inner frame and its driving electrodes is affected by second angle deflection φ 120 of the external frame.

One means of eliminating this coupling is to deflect the driving electrodes of the inner frame such that they remain parallel to the inner frame axis. This can be achieved by fixing the driving electrodes of the inner frame to the same external frame that deflects the inner frame axis. In the present invention this is achieved by multi-level stacking of multiple actuators, one upon the other, each having a single degree of freedom. FIG. 3 gives a schematic illustration of such a stacked micro-mirror.

FIG. 3 is a schematic illustration of a multi-level stacked, uncoupled, two-axis micro-mirror device 300, constructed in accordance with the principles of the present invention. This device is constructed from three levels, as described in greater detail hereinbelow, with reference to FIG. 4.

FIG. 4 shows the separated layers 400 of the device of FIG. 3, constructed in accordance with the principles of the present invention. The first level 410 contains the first level bottom electrodes 412 that drive the first deformable element 431 about the x-axis 440. The second level 420 contains first deformable element 431. First deformable element 431 contains the counter electrodes to the first level bottom electrodes 412 on its lower side. However, the counter electrodes are not visible in a top perspective view. Also, first deformable element 431 contains, on its upper side, the second level bottom electrodes 422 that drive the second deformable element 432 about the y-axis 445. The third level 430 contains the second deformable element 432, of which the frame is attached to the first deformable element 431 on second level 420.

It is understood that in the stacked micro-mirror device there is virtually no electrostatic coupling between the two axes of rotation. Therefore, the electromechanical response of second deformable element 432 is unaffected by the tilting angle of first deformable element 431. This is in contrast to the electromechanical coupling between the axes of rotation of double-gimbaled actuator 100 shown in FIG. 1.

Applications for the present invention include micro electro-mechanical systems (MEMS) devices for optical cross connect, and for use in scanning and displays. Another application is multiple-axes inertial sensors.

Additional applications include inertial sensors, pressure sensors, radio frequency (RF) switches and filters, MEMS displays, as well as double-gimbaled micro-mirrors used in optical communication state of the art all-optics routers, bar-code scanners, scanning confocal microscopes and scanners for direct display on retina.

Having described the present invention with regard to certain specific embodiments thereof, it is to be understood that the description is not meant as a limitation, since further modifications will now suggest themselves to those skilled in the art, and it is intended to cover such modifications as fall within the scope of the appended claims.

We claim:

1. A multi-level decoupled micro-actuator device for a micro-mirror having multiple axes, using micro electro-mechanical systems (MEMS)-on-MEMS stacking technology, said device comprising:

a first level substrate having at least one first level bottom electrode on its upper side;

a second level frame stacked on said first level substrate, said second level frame having a first deformable element rotatable about the x-axis, said first deformable element comprising:

at least one counter electrode on its lower side corresponding to, and oppositely charged to, said at least one first level bottom electrode; and at least one second level bottom electrode on its upper side; and a third level frame stacked on said first deformable element, said third level frame comprising a second deformable element rotatable about the y-axis, said second deformable element comprising:

at least one counter electrode on its lower side corresponding to, and oppositely charged to, said at least one second level bottom electrode;

said first deformable element being driven by said at least one first level bottom electrode, said second deformable element being driven by said at least one second level bottom electrode, such that there is no coupling between said rotation of said first and second deformable elements, respectively, about said x-axis and about said y-axis.

2. The multi-level decoupled micro-actuator device of claim 1, wherein the dual-axis micro-mirror is used for scanning applications.

3. The multi-level decoupled micro-actuator device of claim 1, wherein the dual-axis micro-mirror is used for optical cross-connect for display applications.

4. The multi-level decoupled micro-actuator device of claim 1, wherein the micro-actuator is used for inertial sensor applications.

5. The multi-level decoupled micro-actuator device of claim 1, wherein the micro-actuator is used for pressure sensor applications.

6. The multi-level decoupled micro-actuator device of claim 1, wherein the micro-actuator is used for radio frequency (RF) and filter applications.

7. The multi-level decoupled micro-actuator device of claim 1, wherein the micro-actuator is used for scanning confocal microscopes.

8. The multi-level decoupled micro-actuator device of claim 1, wherein the micro-actuator is used for all-optical routers.

9. The multi-level decoupled micro-actuator device of claim 1, wherein the micro-actuator is used for barcode scanners.

10. The multi-level decoupled micro-actuator device of claim 1, wherein the micro-actuator is used for scanners for direct display on retina.

11. The multi-level decoupled micro-actuator device of claim 1, wherein the multi-level decoupled micro-actuator comprises at least four levels and at least three axes.

12. The multi-level decoupled micro-actuator device of claim 1, wherein the multi-level decoupled micro-actuator comprises side-by-side multi scanners on a decoupled base.

13. The multi-level decoupled micro-actuator device of claim 1, wherein the multi-level decoupled micro-actuator comprises a vertical stack of multi scanners with a parallel axis for mode composition and large scanning angles with low voltages.

14. The multi-level decoupled micro-actuator device of claim 1, wherein the method of actuation is thermoelastic.

15. The multi-level decoupled micro-actuator device of claim 1, wherein the method of actuation is piezoelectric.

16. The multi-level decoupled micro-actuator device of claim 1, wherein the method of actuation is magnetostatic.

17. A method for a multi-level decoupled micro-actuator device for a micro-mirror device having multi axes, using micro electro-mechanical systems (MEMS)-on-MEMS stacking technology, the method comprising:

providing a first level substrate comprising at least one first level bottom electrode;

providing a second level frame stacked on said first level substrate comprising a first deformable element rotatable about the x-axis, said first deformable element comprising:

at least one counter electrode on its lower side corresponding to, and oppositely charged to, said at least one first level bottom electrode; and at least one second level bottom electrode on its upper side, that drives a second deformable element rotatable about the y-axis; and providing a third level frame stacked on said first deformable element, said third level frame comprising said second deformable element rotatable about the y-axis, said first deformable element being driven by said at least one first level bottom electrode, such that there is no coupling between said rotation about said x-axis and said rotation about said y-axis.

* * * * *